United States Patent [19]

Min

[11] Patent Number: 4,825,420

[45] Date of Patent: Apr. 25, 1989

[54] C-MOS ADDRESS BUFFER FOR SEMICONDUCTOR MEMORY

[75] Inventor: Dong S. Min, Seoul, Rep. of Korea

[73] Assignee: Samsung Semiconductor & Telecommunication Co., Ltd., Kyoungsangbuk, Rep. of Korea

[21] Appl. No.: 141,515

[22] Filed: Jan. 7, 1988

[30] Foreign Application Priority Data

Jan. 17, 1987 [KR] Rep. of Korea .................... P.87-345

[51] Int. Cl.⁴ .............................................. G11C 8/00
[52] U.S. Cl. .................................... 365/230; 365/189; 307/269
[58] Field of Search ................ 365/189, 230; 307/268, 307/269

[56] References Cited

U.S. PATENT DOCUMENTS 4,581,549  4/1986  Aoyama et al. ..................... 307/269
4,581,718  4/1986  Oishi .................................. 365/189

Primary Examiner—James W. Moffitt

[57] ABSTRACT

A C-MOS address buffer for use in a semiconductor memory device is clocked by an inverted column address strobe signal $\phi_{CAL}$ of an external column address strobe signal $\overline{CAS}$. The signal $\phi_{CAL}$ is supplied to the drain of a feedback transistor in a schmitt trigger and is reinverted to provide a signal corresponding to the address strobe signal $\overline{CAS}$. This signal is coupled to the gate of a transistor which controls the application of a supply voltage to the schmitt trigger circuit. Invalid timing address signals between the address input signal Ai and the clock signal comprising the signal $\phi_{CAL}$ are thus prevented. Also sufficient address set up time and hold time are guaranteed.

9 Claims, 4 Drawing Sheets

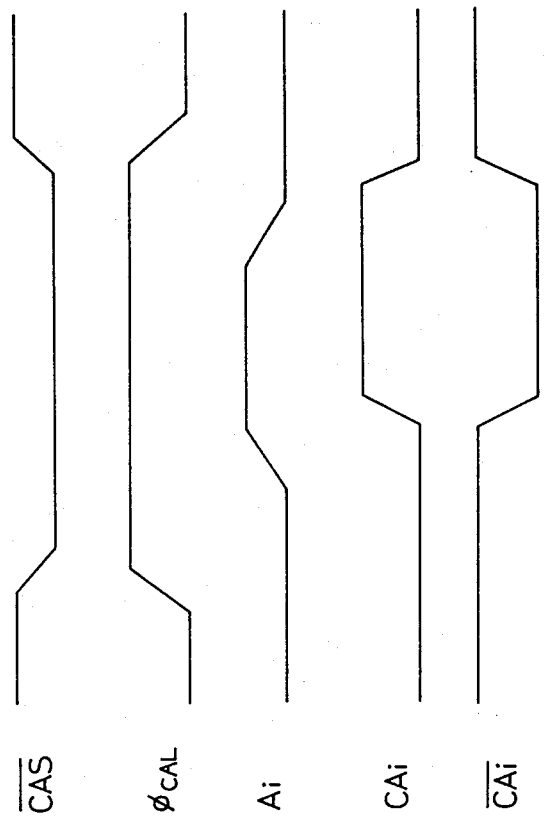

C-MOS ADDRESS BUFFER FOR SEMICONDUCTOR MEMORY

TECHNICAL FIELD

The present invention relates generally to an address buffer of the C-MOS type for use in a semiconductor memory.

It is more specifically directed to a C-MOS column address buffer which produces an output by changing the outer column address TTL (transistor transistor logic) level into a column address signal C-MOS level in a semiconductor memory device having a C-MOS D-RAM.

BACKGROUND OF THE INVENTION

In a semiconductor memory having a C-MOS D-RAM, the address signal, which is applied through an external input pin, is applied at a TTL voltage level.

For an input voltage of the address logic being of a TTL level, a circuit changes the voltage of the address logic level of the incoming TTL level into a C-MOS address logic level capable of operating the inner semiconductor memory device on the address input end.

In general, the TTL typically defines a logic "0" as being less than 0.8 volts, and a logic "1" as being in excess of 2.4 volts.

Accordingly, for C-MOS operation, a logic level voltage of less than 0.8 volts incoming as TTL is made to be 0 volts, and a voltage in excess of 2.4 volts is changed into a level of 5 volts, but a given trip point is placed between above 2.4 volts and 0.8 volts, taking into consideration the change margin of the power source voltage.

In a semiconductor memory device having a C-MOS D-RAM as described above, the column address buffer, which had been used in the prior art, is provided for a circuit as shown in FIG. 1.

In a conventional C-MOS column address buffer, as shown in FIG. 1, the buffer structure will be described as follows.

A Schmitt trigger circuit is comprised of the connection of the P-MOS transistors 1 and 2, and the N-MOS transistors 3, 4, 5 and 6. Series connected P-MOS transistors 1 and 2 and the series connected N-MOS transistors 3 and 4 are connected at the node 24.

Further, the source of said P-MOS transistor 1 is connected with the power source voltage Vcc and that of the N-MOS transistor 4 is connected to ground voltage Vss (0 volt). The gates of the P-MOS transistor 2 and N-MOS transistors 3 and 4 are coupled to the input address signal Ai through the line 23, and the output line of the node 24 is connected with the gate of N-MOS transistor 5 for providing feedback, and, at the same time, with the drain and source of N-MOS transistor 6 coupled between the node 24 and the ground voltage Vss. The source of said N-MOS transistor 5 is connected to the series contact 25 of the N-MOS transistors 3 and 4.

Also, the drain of the transistor 5 is connected to the power source supply voltage Vcc, and the gates of the P-MOS transistor 1 and the N-MOS transistor 6 are connected to an input terminal of the Schmitt trigger circuit 100 and receiving an inverted input of the signal $\phi_{CAL}$ from inverter 110 comprised of series connection of the N-MOS transistors 7 and 8 coupled between the power source supply voltage Vcc and the ground voltage Vss. An inverter 120 comprised of the D-MOS transistor 9 and the N-MOS transistor 10 buffers the column address signal having a C-MOS level generated at the node 24 of said Schmitt trigger circuit 100. A transmission gate 130 which is comprised of the parallel connection of the P-MOS transistor 11 and the N-MOS transistor 12 transfers the output of the inverter 120 when a column address strobe signal $\overline{CAS}$ on line 36 becomes active. C-MOS inverters 150, 160 and 170 are connected in series to the output line 27 of the transmission gate 130.

Furthermore, the input line 28 of the inverter 160 is fed to the inverter 180 through the line 31, and the input line 29 of the inverter 170 is connected with the line 27 through the line 30 and the transmission gate 140 which is comprised of the parallel connection of the C-MOS transistor 13 and the N-MOS transistor 14.

Accordingly, when the column address strobe signal $\overline{CAS}$ on line 36 is not in the active or high state ($\theta_{CAL}$ equals "low" state), the transmission gate 140 is conductive. Thus the logic state on the line 33 is latched "low" and that on the line 32 "high" as shown in FIG. 2.

However, in a conventional C-MOS D-RAM, the column address signal Ai is fed from the column address input pin after said column address strobe signal $\overline{CAS}$ is fed from the input pin. Accordingly, a conventional column address input buffer circuit as shown in FIG. 1 has problems with glitches 34 and 35 of FIG. 2 which take place on output lines 32 and 33 before the column address signal Ai is outputted and after said column address strobe signal $\overline{CAS}$ becomes "low" as shown in the operation timing diagram of FIG. 2. That is, when the column address strobe signal $\overline{CAS}$ is in a "high" state ($\phi_{CAL}$: "low" state), the output line 36 from the inverter 110 has a "high" state and the N-MOS transistor 6 is conductive. Accordingly, the input of the inverter 120 assumes a "low" state and output line 36 is held in a "high" state. Then, when the signal $\phi_{CAL}$ of the column address strobe signal is inverted and becomes a "high" state (then the signal $\overline{CAS}$ is in a "low" state), the output of said inverter 110 becomes a "low" state and the transmission gate 130 becomes conductive.

Thus, the signal of a "high" state on said line 26 is transferred on the line 27 and lines 32 and 33 have "low" and "high" states, respectively. Then, the P-MOS transistor 1 has an "ON" state according to the "low" state on line 36, the output signal of said inverter 110. The N-MOS transistor 6 is in an "OFF" state and the input line 23 has a "low" state.

Accordingly, the P-MOS transistor 2 has a saturated state and the node 24 is in a "high" state.

Thus, the output line 26 of the inverter 120 is in a "low" state and the signals of the lines 32 and 33 are in "high" and low" states, respectively, being applied through the transmission gate 130.

Accordingly, the Schmitt trigger circuit 100 becomes operative after said signal $\overline{CAS}$ is in a "low" state, and the glitches 34 and 35 of FIG. 2 are produced with like amounts of delay time until the node 24 is in a "high" state, and the address signal is produced and the undesired problems, which should be obviated, take place.

OBJECTS AND SUMMARY OF THE INVENTION

It is an object of the present invention to provide a reliable C-MOS column address input buffer circuit which will not generate an invalid address by the timing between the input address and the control clock.

It is another object of the present invention to provide a column address input C-MOS buffer circuit which ensures sufficient address set up time and hold time margin while consuming little power.

The present invention comprises a semiconductor memory device having a C-MOS D-RAM which includes a Schmitt trigger circuit having a transistor for cutting off the power supply potential to the trigger circuit in response to a column address strobe signal and inverter signal $\phi_{CAL}$ applied as the control clock and a feedback transistor, the transistor cutting off the power source supply and feedback transistor being synchronized, so that glitches are suppressed; an inverter buffer coupled to the output of the Schmitt trigger circuit; a transmission gate transferring the output of the inverter by the control clock; a latch circuit latching the address logic level of the active state when the column address strobe signal is not in the active state; and buffer means producing a column address signal CAi and inverted signal $\overline{CAi}$ corresponding to an input address signal.

Other features and advantages of the present invention will become apparent from the following detailed description, taken in conjunction with the accompanying drawings.

BRIEF DESCRIPTION OF THE DRAWINGS

FIG. 4 operation timing diagram of FIG. 3.

DETAILED DESCRIPTION OF THE INVENTION

Figure 1:
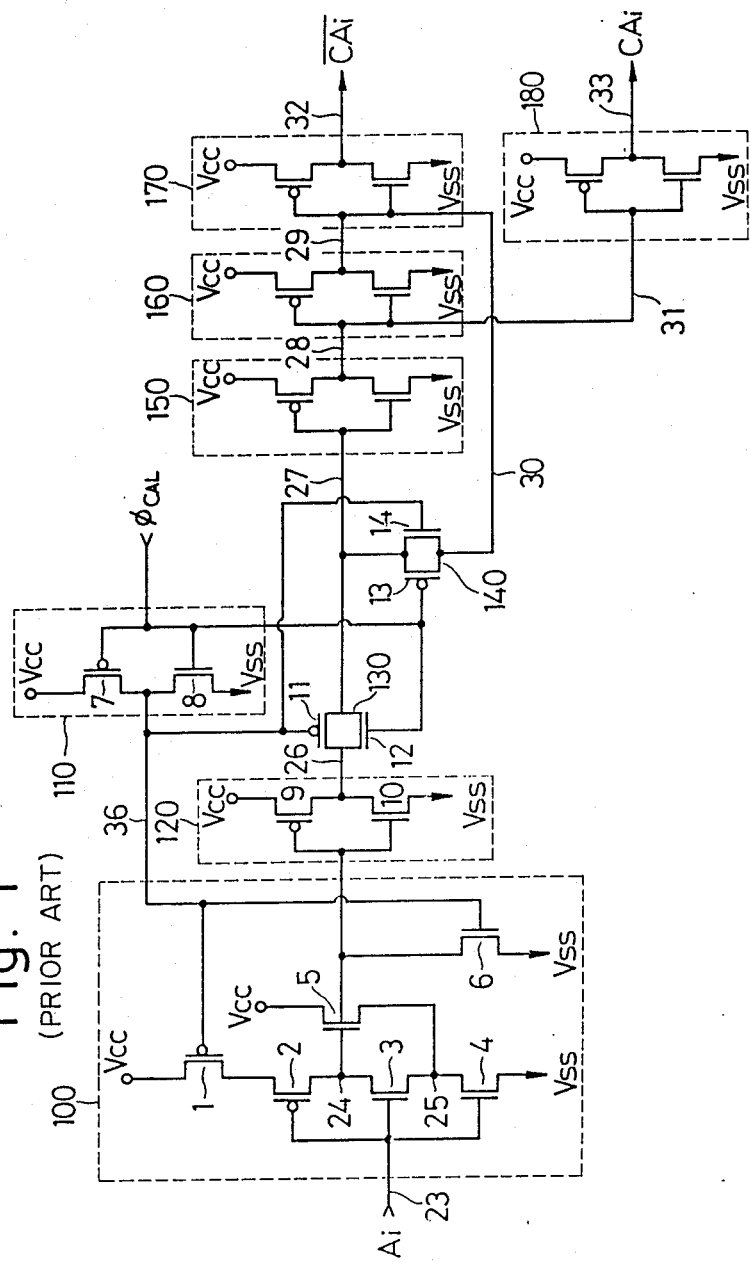
FIG. 1 is a conventional circuit diagram of a known prior art circuit.
Figure 2:
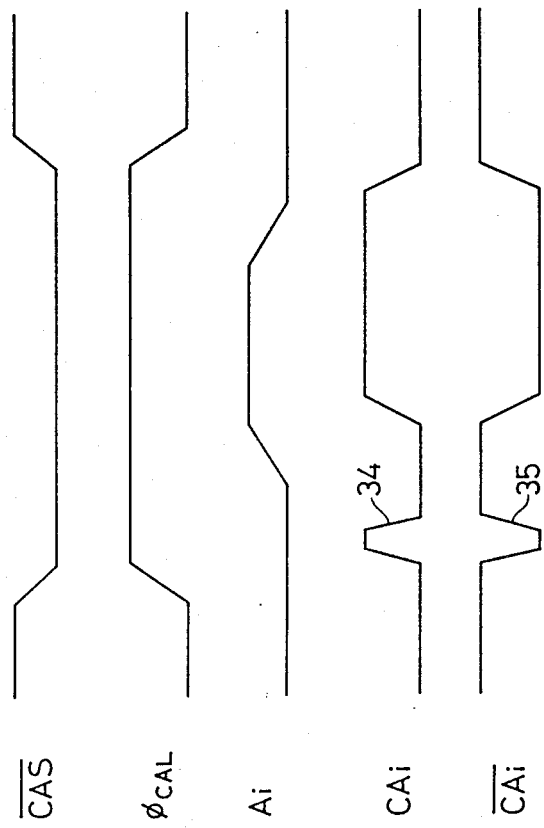
FIG. 2 is an operation timing diagram of FIG. 1.
Figure 3:
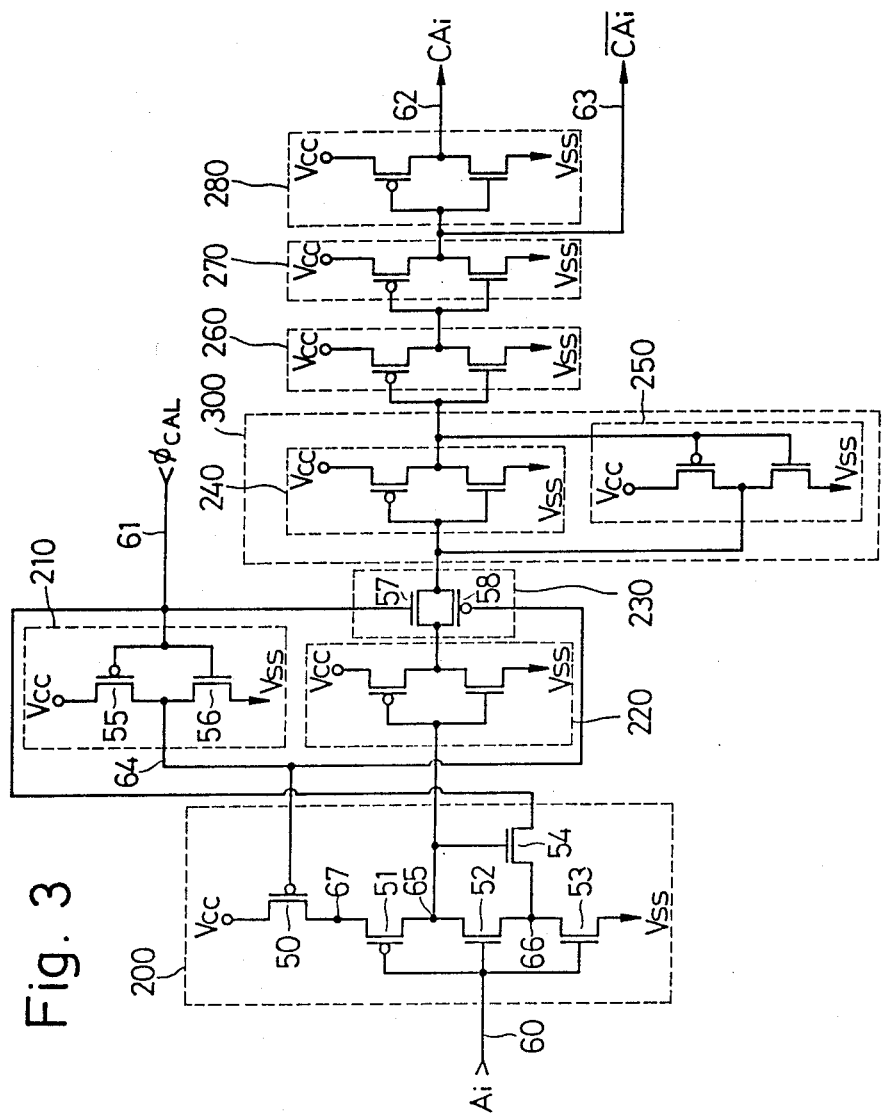
FIG. 3 is a circuit diagram according to the present invention.

FIG. 3 is a drawing which discloses a column address input buffer circuit, according to the subject invention, and which is respectively used in connection with a C-MOS dynamic random access memory (D-RAM) having a plurality of column address input pins, easily understood to one skilled in the art. The column address input signal Ai having a TTL level is inputted on the input line 60 which is a signal line connected with an external column address input pin of a D-RAM device, not shown.

Further, the signal $\phi_{CAL}$ which is the inverse of said column address strobe signal $\overline{CAS}$ is fed from the output of the D-RAM device and is applied on the input line 61. Accordingly, the input of the column address signal which is the selected column line (or bit line) in the memory cell of the D-RAM is applied after said column address strobe signal $\overline{CAS}$ is in a "low" state.

The signal, $\phi_{CAL}$, which is used as an incoming control signal on the input line 61, is impressed on the gate of the transistors 55 and 56 of a conventional C-MOS inverter 210 wherein a P-MOS transistor 55 and an N-MOS transistor 56 are connected in series between the power source supply voltage Vcc (5 volts) and the ground voltage Vss (0 volt).

The inverted signal $\overline{CAS}$ of said signal $\phi_{CAL}$ appears on the output line 64 and is used as a clock signal which controls the Schmitt trigger circuit 200 incoming the column address signal Ai on the input line 60. In the Schmitt trigger circuit 200, the series connected P-MOS transistors 50 and 51 are connected in series with the series connected N-MOS transistors 52 and 53 through a contact 56. The power supply voltage Vcc is connected to the source of the P-MOS transistor 50 and the ground voltage Vss is connected to the source of the N-MOS transistor 53. Further, the column address input signal Ai is impressed on the gates of said transistors 51, 52 and 53. Also, the gate of the P-MOS transistor 50 having a switching operation is connected with the output line 64 of the inverter 210. The contact 65 is connected with the gate of an N-MOS transistor 54 for feedback. The drain of the N-MOS transistor 54 is connected with the line 61 for the input signal $\phi_{CAL}$. The source is connected to the series contact 66 of the N-MOS transistors 52 and 53.

Accordingly, said schmitt trigger circuit 200 is controlled by the state of the input signal $\phi_{CAL}$ on the line 61. That is, when the signal $\phi_{CAL}$ becomes a low state ($\overline{CAS}$: "high" state), the output of the inverter 210 exhibits a "high" state and the transistor P-MOS 50 goes to an "OFF" state.

Thus, the Schmitt trigger circuit is not operative and when the signal $\phi_{CAL}$ becomes a "high" state (signal $\overline{CAS}$: "low" state), the transistor 50 on the P-MOS goes to an "ON" state.

When a voltage of a "high" state is supplied on the drain of the feedback transistor 54, the Schmitt trigger circuit 200 is enabled. The Schmitt trigger circuit 200 has the function of converting the level of the TTL input address signal on line 60 into a C-MOS level signal.

According to another feature of the present invention, a minimum voltage of 2.4 volts, which is shown being the "high" state of the TTL and 0.8 volts, which is shown as a "low" state of the TTL, a trip point comprising a middle value of 1.6 volts maximum is determined and the margin of the change of the power supply voltage Vcc is maximized.

At this time, the ratio (width/length) of width(W) and channel length (L) of the gate, the $\beta$ ratio of transistors P-MOS 50 and 51, is determined to be 15/1.6 and 30/1.6, respectively, and the $\beta$ ratio of both the transistors N-MOS 52 and 53 is 48/1.4, and the $\beta$ ratio for the feedback transistor 54 is 4.4/1.4.

Thus, for the Schmitt trigger circuit 200, the P-MOS transistor 51 is operated, as in the conventional circuit, in the linear region of its operational characteristic and in the case of Ai being below 1.6 volts, it causes node 65 to have a "high" state (5 volts). Further, the feedback transistor 54 is operated in its saturated state, causing the N-MOS transistor 52 to be in an "OFF" condition. Accordingly, the node 65 sets 5 volts as the "high" C-MOS state.

On the other hand, in the case of Ai being more than 1.6 volts, the P-MOS transistor 51 is operated in the saturation region, and the N-MOS 53 is operated in the linear region, and the N-MOS transistor 54 is operated in the saturation region. Furthermore, the feedback transistor 54 is changed from its saturation state into its "OFF" state. The node 65 is then forced into the "low" C-MOS state (0 volt).

The Schmitt trigger circuit 200 is connected to a C-MOS inverter 220. The output of the inverter 220 is connected to the source of the N-MOS transistor 57 and the P-MOS transistor 58, while the signal line 61 is connected to the gate of the N-MOS transistor 57.

The two transistors 57 and 58 are also connected in parallel to the transmission gate 230.

As to the transmission gate 230, when the signal $\phi_{CAL}$ is in a "high" state, the output of the inverter 220 is transferred thereto and when the signal is in a "low" state, the output is inhibited. The output of the transmission gate 230 is fed to a latch circuit 300 comprising two C-MOS inverters 240 and 250.

In the latch circuit 300, the output of the inverter 240 is connected back to its input through the inverter 250.

Thus, the latch circuit 300 is precisely latched to the logic state of the incoming address signal Ai and provides an output of the column address signal CAi.

The output CAi of the latch circuit 300 provides the address signal CAi which is the inverted logic state of the TTL level applied to the input line 60 on the output line 62 through the series connected inverters 240, 270 and 280 but having a C-MOS logic state level. An inverted address signal $\overline{CAi}$ from the output of the inverter 270 is provided on the output line 63. Accordingly, the section which comprises the series connected inverters 260, 270 and 280 provides a buffer circuit to activate a column decoder, not shown, connected to output lines 62 and 63.

Furthermore, FIG. 4 is a timing diagram drawing illustrating operation of the present invention shown in FIG. 3. The operation of FIG. 3 will now be described in detail.

When a column address strobe signal $\overline{CAS}$, from an output pin of a semiconductor memory device having a C-MOS D-RAM is in a "low" state, the signal $\phi_{CAL}$ controlling the column address buffer is in a "high" state and produces an input on input line 61 of FIG. 3. The signal $\phi_{CAL}$ is inverted to provide a signal corresponding to $\overline{CAS}$ at the output of inverter 210 and is applied as an input to the gate of the P-MOS transistor 50 and the drain of the N-MOS feedback transistor 54 respectively, whereupon the Schmitt trigger circuit 230 is enabled. Accordingly, the TTL level of the address signal incoming on the input line 60, as stated above, appears as an output on the node 65 as an inverted C-MOS level signal.

That is, when the TTL logic level of a "high" state appears as an input on the input line 60, the voltage of the node 65 is less and reduced further by the N-MOS transistor 53 operating in the linear region and the transistor N-MOS 52 operating in the saturation region, and the N-MOS transistor 54 effects an "OFF" state. Finally, the node 65 reaches a 0 volt state. Accordingly, the logic state of the input address signal and the inverse logic state produced at the output of the Schmitt trigger circuit 200 is inverted by the inverter 220 and becomes a 5 volt "high" state.

Further, the high output state of the buffer inverter 220 is fed to the latch circuit 300 through the transmission gate 230 having an "ON" state by the signal $\phi_{CAL}$ on line 61 and the inverse signal of the signal on line 64. A "high" state is produced on output line 62 having the inverters 260, 270 and 280 comprising the buffer circuit, while a "low" state (0 volt) appears on the line 63.

Also, when the input address signal Ai becomes a "low" state, the output of the schmitt trigger circuit 200, as described above, has a "high" state, and finally, a "low" condition (0 volt) appears on the output line 62 while a "high" state (5 volts) appears on the output line 63. On the other hand, when the signal $\overline{CAS}$ and which corresponds to the signal on line 64, goes to a "high" state, the signal $\phi_{CAL}$ is in a "low" state and the transistor P-MOS 50 is in an "OFF" state.

Under such conditions, the Schmitt trigger circuit 200 is inoperative and the outer address is cut off. Further, because the transmission gate 230 also effects an "OFF" state, the latch circuit 300 and the logic state of $\overline{CAi}$ on the output line 63, i.e. the state immediately before the signal $\phi_{CAL}$ becomes and is continuously held in a "low" state.

As stated above, because the column address buffer is controlled i.e. clocked by the operation of one signal $\phi_{CAL}$, sufficient address set up time and hold time margin may be ensured.

Furthermore, in the case of a D-RAM suitable for a memory capacity of 1 mega bit, the column address buffer is important because all of 10 column address buffers should be used.

Accordingly, the present invention is provided with a control of power consumption because the P-MOS transistor 50 of the Schmitt trigger circuit 200 is controlled by the signal $\phi_{CAL}$.

Also, the drain of the feedback transistor 54 in the Schmitt trigger circuit is not connected to the supply terminal of the power source but is connected to the signal $\phi_{CAL}$.

Also, because the P-MOS transistor 50 and the feedback transistor 54 are synchronized to the signal $\phi_{CAL}$, an invalid address caused by timing between the column address buffer control clock $\phi_{CAL}$ and the address input signal Ai, is obviated.

Accordingly, the present invention ensures sufficient address set up time and hold time, and with the advantage of preventing an invalid address.

I claim:

1. A C-MOS address buffer for a semiconductor memory comprising:
   a first signal inverter coupled to a clock signal and providing an inverted clock signal output corresponding to a column address strobe signal;
   a schmitt trigger circuit coupled across a power supply source and including a first set of first type series connected transistors and a second set of second type series connected transistors coupled together at a circuit node, wherein one transistor of said first set of transistors is coupled to said inverter and controlled by said inverted clock signal to cut off said power supply source from said schmitt trigger circuit, and wherein said schmitt trigger circuit additionally includes a feedback transistor coupled between said second set of transistors and said clock signal whereby said feedback transistor and said one transistor operate in synchronism to generate an level shifted intermediate output address signal at said circuit node of an address signal applied to said schmitt trigger circuit;
   a second signal inverter coupled to said circuit node,
   a transmission gate coupled to said second signal inverter and being operable in response to said clock signal and said inverted clock signal to transfer said level shifted intermediate output address signal to a latch circuit;
   said latch circuit coupled to said transmission gate for latching the logic state of said level shifted output address for a predetermined logic state of said clock signal; and
   an output buffer circuit coupled to said latch circuit for providing a level shifted output address signal and an inverted level shifted output address signal.

2. The C-MOS address buffer according to claim 1 wherein said first set of first type transistors comprise P-MOS transistors and said second set of second type transistors comprise N-MOS transistors.

3. The C-MOS address buffer according to claim 2 wherein said one transistor of said first set of transistors comprises a P-MOS transistor having a source, drain, and gate, and wherein said source is coupled to said power supply source, said gate is coupled to said inverter and said drain is coupled to the other P-MOS transistor of said first set of transistors.

4. The C-MOS address buffer according to claim 2 wherein said feedback transistor comprises an N-MOS transistor having a source, drain, and gate, and wherein said source is coupled between said second set of series connected N-MOS transistors, said gate is coupled to said circuit node, and said drain is coupled to said clock signal.

5. The C-MOS address buffer according to claim 2 wherein said first inverter comprises a P-MOS transistor and an N-MOS transistor connected in series, each having a source, drain, and gate, and wherein said source and drains are coupled in series across said power supply source and said gates are coupled together in parallel to said clock signal, and wherein a common connection between said sources and said drains is coupled to said P-MOS one transistor of said first set.

6. The C-MOS address buffer according to claim 2 wherein said second inverter comprises a P-MOS transistor and an N-MOS transistor connected in series, each having a source, drain, and gate, and wherein said source and drains are connected in series across said power supply source and said gates are coupled together in parallel to said circuit node, and wherein a common connection between said sources and said drains is coupled to said transmission gate.

7. The C-MOS address buffer according to claim 2 wherein said transmission gate comprises a P-MOS transistor and an N-MOS transistor connected in parallel, each having a source, drain, and gate, and wherein said sources and drains are coupled in parallel between said second inverter and said latch circuit and wherein said gates are respectively coupled to said clock signal and said inverted clock signal.

8. The C-MOS address buffer according to claim 2 wherein said latch circuit comprises a third and fourth inverter each comprising a P-MOS transistor and an N-MOS transistor connected in series and each further having a source, drain, and gate, and wherein said sources and drains are coupled in series across said power supply source, and wherein said gates of said third inverter are coupled together in parallel to said transmission gates and the common connection between said sources and drains of said fourth inverter is coupled to said transmission gate, and wherein a common connection between said sources and drains of said third inverter is coupled to a parallel connection of the gates of said fourth inverter.

9. The C-MOS address buffer according to claim 2 wherein said output buffer circuit comprises at least one inverter circuit comprised of a P-MOS transistor and an N-MOS transistor connected in series, each having a source, drain, and gate, and wherein said sources and drains are coupled in series across said power supply source, and wherein said gates are coupled in parallel to said latch circuit, and a common connection between said sources and drains providing said level shifted output address signal.

* * * * *